(12) United States Patent
Liaw

(10) Patent No.: US 6,214,656 B1
(45) Date of Patent: Apr. 10, 2001

(54) PARTIAL SILICIDE GATE IN SAC (SELF-ALIGNED CONTACT) PROCESS

(75) Inventor: Jhon-Jhy Liaw, Taipei (TW)

(73) Assignee: Taiwian Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/313,301

(22) Filed: May 17, 1999

(51) Int. Cl.$^7$ ............................................. H01L 21/8238

(52) U.S. Cl. ..................... 438/199; 438/257; 438/241

(58) Field of Search .................................. 438/199, 200, 438/257, 275, 258, 241, 586, 655, 664, 683

(56) References Cited

U.S. PATENT DOCUMENTS

| 5,550,079 | 8/1996 | Lin | 437/56 |
|---|---|---|---|
| 5,668,035 | 9/1997 | Fang et al. | 438/239 |
| 5,792,684 | * 8/1998 | Lee et al. | 438/238 |
| 5,837,601 | 11/1998 | Matsumoto | 438/592 |
| 5,863,820 | * 3/2000 | Huang | 438/241 |
| 6,037,222 | * 3/2000 | Huang et al. | 438/257 |

OTHER PUBLICATIONS

Wolf, "Silicon Processing for the VLSI Era", vol. :2 Process Integration, Lattice Press, Sunset Beach, CA, c.1990, pp. 144–149.

Chang et al., "ULSI Technology", The McGraw–Hill Companies, Inc., New York, NY, c. 1996, pp. 397–402, and pp. 487–488.

* cited by examiner

Primary Examiner—Caridad Everhart
(74) Attorney, Agent, or Firm—George O. Saile; Stephen B. Ackerman; Rosemary L. S. Pike

(57) ABSTRACT

A method for integrating salicide and self-aligned contact processes in the fabrication integrated circuits is described. A polysilicon layer is deposited overlying a gate oxide layer and isolation areas. Ions are implanted into the polysilicon layer to define a surface channel dual gate wherein an NMOS gate area is formed on one side of the substrate and a PMOS gate area is formed on the other side of the substrate and the junction where the NMOS gate area meets the PMOS gate area forms a CMOS gate area. A hard mask layer is deposited overlying the polysilicon layer. The hard mask and polysilicon layers are patterned to form NMOS and PMOS gates. Optionally, an etch stop layer is deposited over the gates and associated source and drain regions. The hard mask layer is removed overlying the CMOS gate and one of the NMOS or PMOS gates where a contact is to be made to the gate. A metal layer silicide is formed where the hard mask has been removed by a salicide process. A self-aligned contact opening is formed through an insulating layer to one of the source and drain regions. A contact opening is formed through the insulating layer to the metal silicide layer overlying the gate where the contact is to be made. A conducting layer is deposited over the semiconductor substrate and within the self-aligned contact opening and within the contact opening and patterned to complete fabrication of the integrated circuit device.

30 Claims, 8 Drawing Sheets

# PARTIAL SILICIDE GATE IN SAC (SELF-ALIGNED CONTACT) PROCESS

BACKGROUND OF THE INVENTION (1) Field of the Invention

The present invention relates to the fabrication of integrated circuit devices, and more particularly, to a method of integrating partial silicide and self-aligned contact processes in the fabrication of integrated circuits.

(2) Description of the Prior Art

In deep submicron ULSI technology, low voltage applications and low threshold voltages are required to decrease power consumption and to increase circuit speed. For ease of fabrication, n-doped polysilicon gates have been used for both n-channel and p-channel devices. These buried channel type PMOS devices are quite susceptible to short channel effects. Great improvement can be made if both PMOS and NMOS devices are surface channel types. In the dual gate surface channel CMOS process, where an NMOS and a PMOS gate come together, a silicide layer is formed thereover to reduce resistance and to ensure ohmic contact. Salicide or polycide technology is used in the dual gate process.

In silicidation, a refractory metal layer is deposited and then annealed. The underlying silicon reacts with the refractory metal layer to produce a silicide overlying the gate electrode. The silicided gate has lower resistance than non-silicided regions, especially in smaller geometries, and hence, higher circuit performance.

In some processes, such as the self-aligned contact process, it is difficult to incorporate the salicide or polycide gate process because of thermal cycling or auto-doping concerns. That is, if the silicide is formed just after gate definition, the subsequent thermal cycles for driving in LDD and source/drain regions and forming spacers, for example, will cause auto-doping of the gate through the silicide layer or will degrade the resistance of the silicide. It is desired to introduce a partial silicide process to connect a CMOS surface channel gate into a SAC process.

Silicidation has been widely used in the art. Silicidation techniques and self-aligned contacts are discussed in *Silicon Processing for the VLSI Era*, Vol. 2, by S. Wolf, Lattice Press, Sunset Beach, Calif., c. 1990, pp. 144–149 and in *ULSI Technology*, by C. Y. Chang and S. M. Sze, McGraw-Hill, New York, N.Y., c. 1996, pp.397–402 and 487–488. U.S. Pat. No. 5,668,035 to Fang et al and U.S. Pat. No. 5,837,601 to Matsumoto teach dual gate processes. U.S. Pat. No. 5,550,079 to Lin teaches forming a nitrogen-containing silicide shunt over dual gate CMOS devices.

SUMMARY OF THE INVENTION

Accordingly, it is a primary object of the present invention to provide an effective and very manufacturable method for integrating salicide and self-aligned contact processes in the fabrication of integrated circuits.

It is a further object of the invention to provide a process for integrating salicide and self-aligned contact processes in the fabrication of dual gate surface channel devices.

Yet another object is to incorporate a partial silicide process to connect a surface channel CMOS gate into a self-aligned contact process.

In accordance with the objects of the invention, a method for integrating salicide and self-aligned contact processes in the fabrication integrated circuits is achieved. Isolation areas are formed on a semiconductor substrate surrounding and electrically isolating device areas. A gate oxide layer is provided in the device areas. A polysilicon layer is deposited overlying the gate oxide layer and isolation areas. Ions are implanted into the polysilicon layer to define a surface channel dual gate wherein an NMOS gate area is formed in one device area and a PMOS gate area is formed in an adjoining device area and the junction where the NMOS gate area meets the PMOS gate area forms a CMOS gate area. A hard mask layer is deposited overlying the polysilicon layer. The hard mask layer and polysilicon layer are patterned to form an NMOS gate in the NMOS gate area, a PMOS gate in the PMOS gate area and a CMOS gate in the CMOS gate area wherein the CMOS gate comprises an NMOS gate adjacent to and adjoining a PMOS gate. Spacers are formed on the sidewalls of the gates. Source and drain regions are formed within the semiconductor substrate associated with the gates. Optionally, a liner layer is deposited overlying the gates and associated source and drain regions. The hard mask layer is removed overlying the CMOS gate and overlying one of the NMOS or PMOS gates where a contact is to be made to the gate. A metal layer is deposited overlying the substrate and annealed wherein the metal layer is transformed into a metal silicide layer where it is not underlaid by the hard mask layer. The metal layer that is not transformed into a metal silicide layer is removed. An insulating layer is deposited over the surface of the semiconductor substrate. A self-aligned contact opening is formed through the insulating layer to one of the source and drain regions. A contact opening is formed through the insulating layer to the metal silicide layer overlying the gate where the contact is to be made. A conducting layer is deposited over the semiconductor substrate and within the self-aligned contact opening and within the contact opening and patterned to complete fabrication of the integrated circuit device.

BRIEF DESCRIPTION OF THE DRAWINGS

In the accompanying drawings forming a material part of this description, there is shown:

FIGS. 1 through 14 are cross-sectional representations of a preferred embodiment of the present invention. FIGS. 1–3, 7–10, and 14 illustrate view I—I of FIG. 15. FIGS. 4–6 and 11–13 illustrate view II—II of FIG. 15.

DESCRIPTION OF THE PREFERRED EMBODIMENTS

Figure 1:
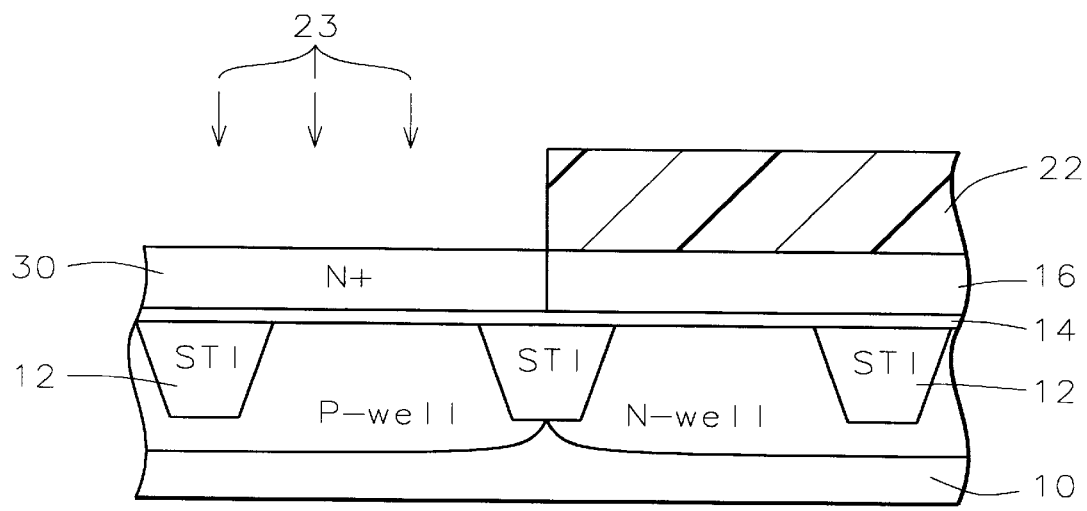

Referring now more particularly to FIG. 1, there is shown a semiconductor substrate 10, preferably composed of monocrystalline silicon. Isolation regions such as field oxide regions or shallow trench isolation 12 may be formed as is conventional in the art.

N-wells and P-wells may be formed by ion implantation. A layer of gate oxide 14 is grown over the surface of the substrate, typically to a thickness of between about 40 and 100 Angstroms. A layer of undoped polysilicon or amorphous silicon 16 is deposited over the gate oxide and isolation regions to a thickness of between about 1000 and 3000 Angstroms.

Now, the dual gate of the invention will be defined by N+ and P+ implantations. A layer of photoresist is coated over the substrate, and exposed, developed, and patterned to form the photoresist mask 22 covering the planned PMOS side of the wafer. N+ ions, for example As or P31, are implanted 23 into the NMOS side of the wafer not covered by the photoresist mask 22. The photoresist mask 22 is removed. NMOS surface channel region 30 is formed.

Figure 2:
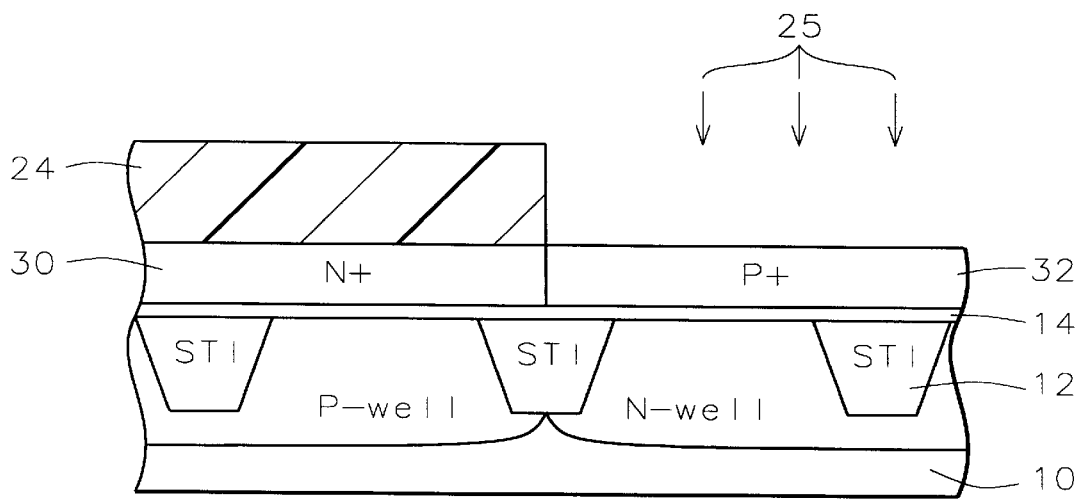

Next, referring to FIG. 2, a photoresist mask 24 is formed over the substrate covering the NMOS side of the wafer. P+ ions, for example B11 or $BF_2$, are implanted 25 into the PMOS side of the wafer not covered by the photoresist mask 24. The photoresist mask 24 is removed. PMOS surface channel region 32 is formed.

Figure 3:
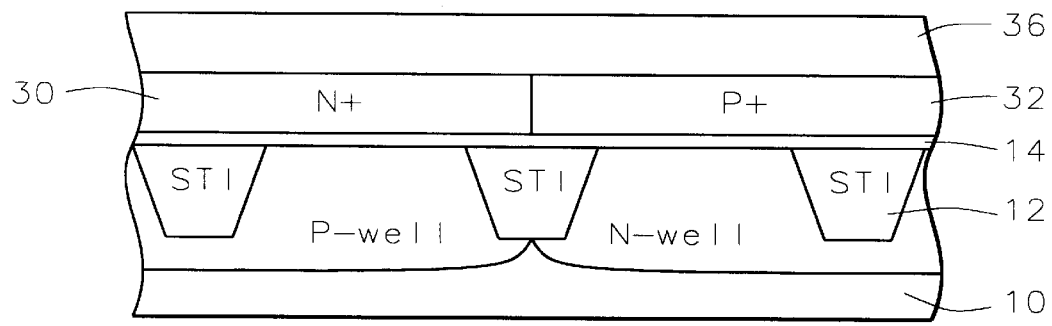

Referring now to FIG. 3, a hard mask layer 36 is deposited over the NMOS and PMOS gates 30 and 32, respectively. The hard mask layer may comprise silicon nitride ($Si_3N_4$) having a thickness of between about 1500 and 3000 Angstroms or a dual layer of silicon dioxide having a thickness of 100 to 1000 Angstroms underlying a silicon nitride layer having a thickness of 1000 to 3000 Angstroms.

Figure 4:
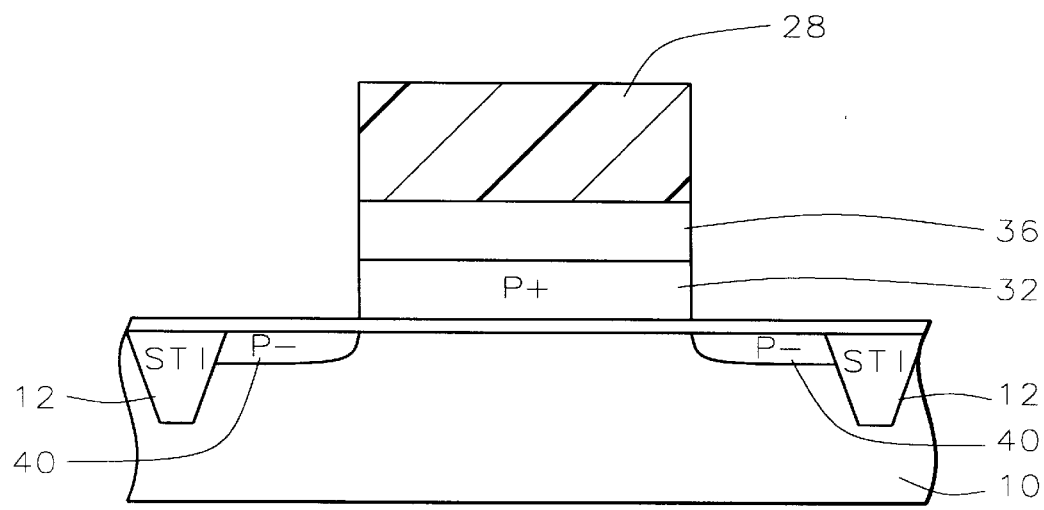
Figure 5:
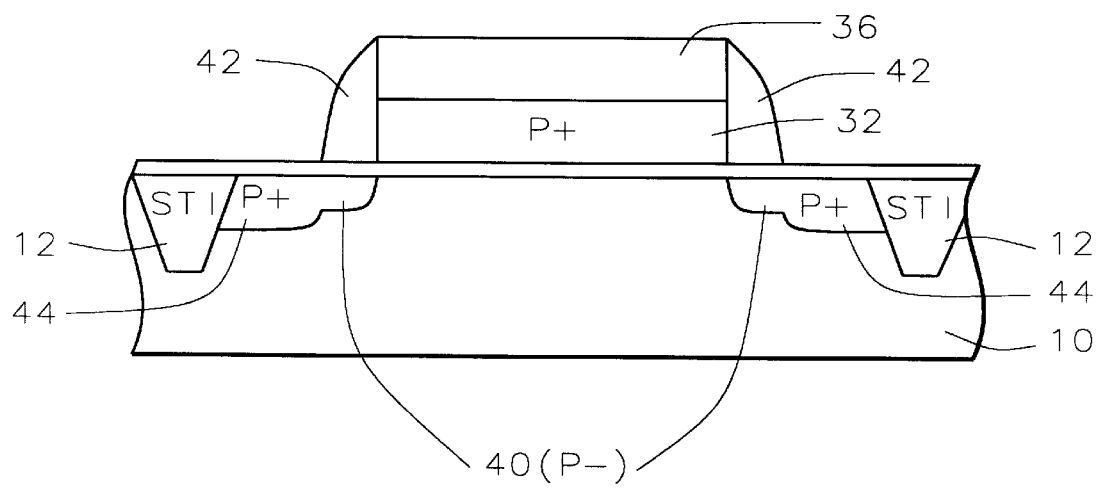
Figure 6:
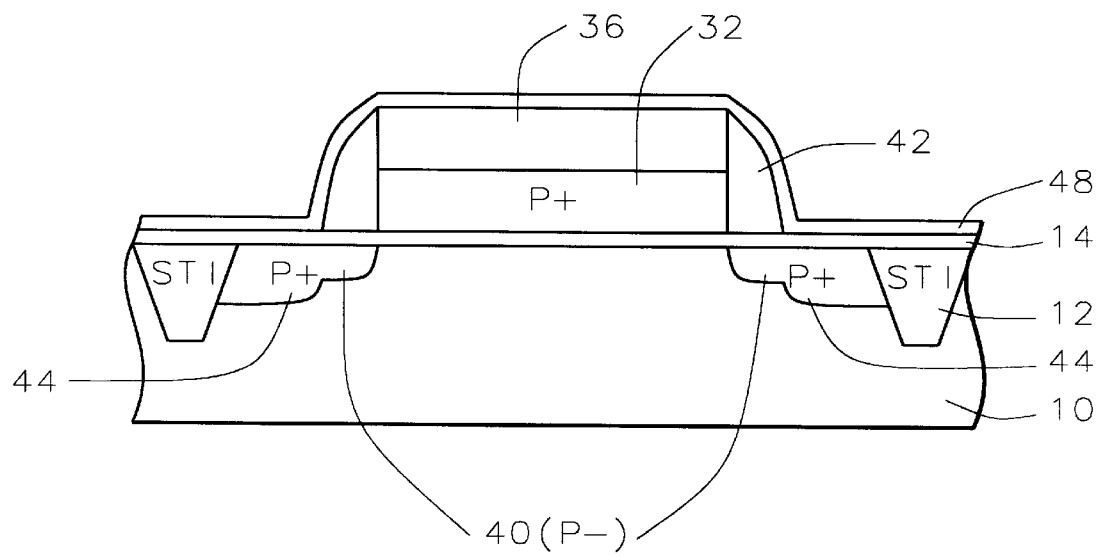
Figure 7:
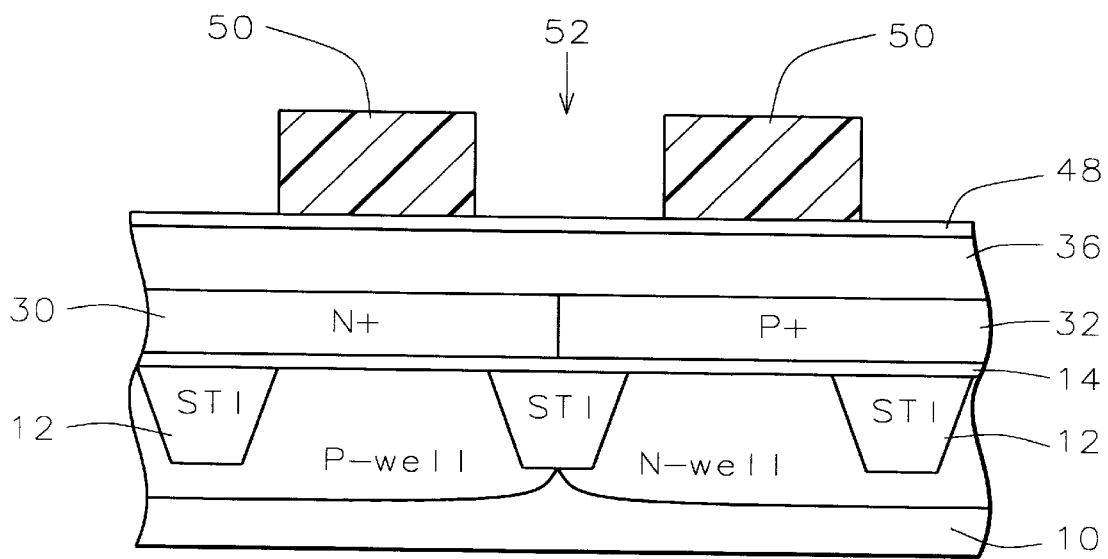

FIGS. 4–6 illustrate another view of the substrate taken perpendicularly to the view illustrated in FIGS. 1–3. FIGS. 4–6 illustrate view II—II of the top view in FIG. 15. This view shows a PMOS gate, but it is to be understood that the NMOS gate is formed in the same way.

A photoresist mask 28 is formed over the hard mask layer 36. The hard mask and polysilicon layers 36 and 32 are etched away where they are not covered by the mask 28 to form gates, as shown in FIG. 4. An LDD implant may be made at this time to form lightly doped regions 40.

The mask 28 is removed. Silicon nitride spacers 42 are formed on the sidewalls of the gates, as conventional in the art and as shown in FIG. 5. Source and drain regions 44 are formed by conventional ion implantation associated with the NMOS and PMOS gates and driven in by annealing.

Referring now to FIG. 6, in one preferred embodiment of the invention, a silicon nitride liner layer is deposited over the surfaces of the substrate as a SAC etch stop layer. This layer 48 has a thickness of between about 100 and 600 Angstroms.

In a key feature of the invention, the hard mask layer will be removed in the area of the junction between the NMOS and PMOS gates. A silicide layer will be formed thereover to reduce resistance and to ensure ohmic contact. This junction area forms the CMOS gate.

Figure 8:
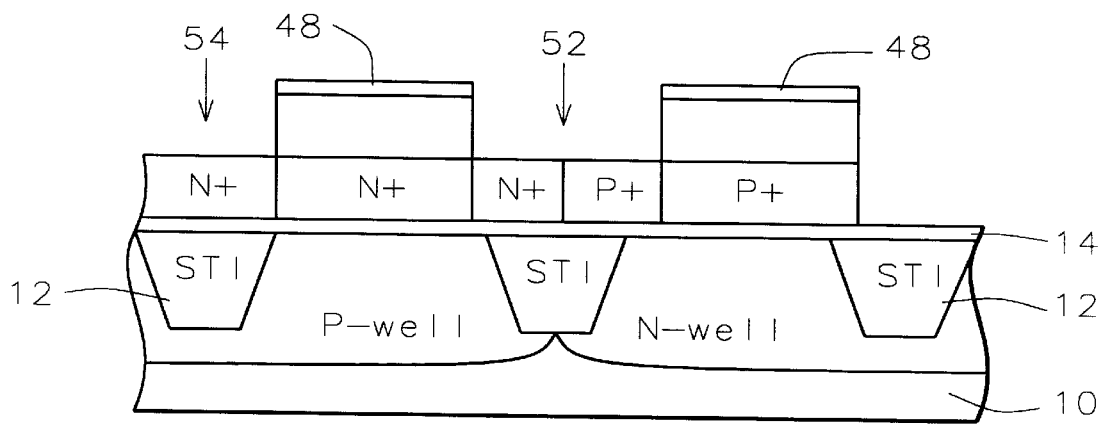
Figure 15:
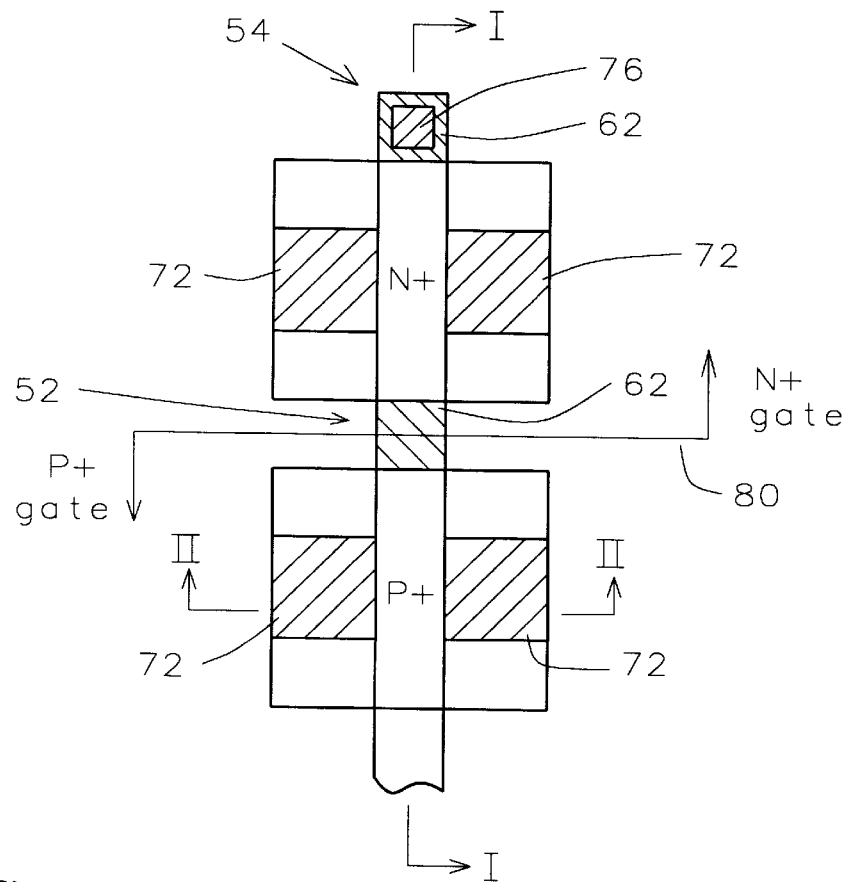
FIG. 15 is a top-view of a memory device of the present invention.

FIGS. 7–10 illustrate view I—I of the top view in FIG. 15. A photoresist mask 50 is formed over the hard mask layer to define areas where the hard mask is to be removed, including the CMOS gate areas 52 where NMOS and PMOS gates meet. The hard mask 36 and the liner layer 48, if present, are removed in these areas not covered by the photoresist mask 50, as shown in FIG. 8. These areas include CMOS gate area 52 and contact area 54, shown in FIG. 8 and in top view in FIG. 15.

Figure 9:
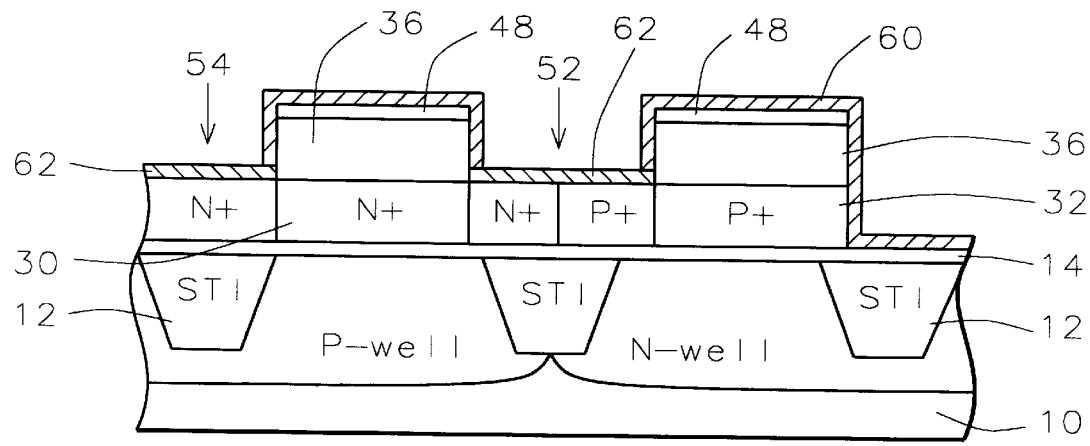

Referring now to FIG. 9, a titanium or cobalt layer 60 is deposited over the surface of the substrate, typically by sputtering.

The substrate is annealed, for example, using a rapid thermal anneal (RTA) in a nitrogen ambient at a temperature of 600 to 700° C. The metal layer 60 reacts with the polysilicon in the dual gates to form metal silicide 62. The metal overlying the isolation regions 12, the hard mask layer 36, and the SAC liner layer 48 is unchanged.

Figure 10:
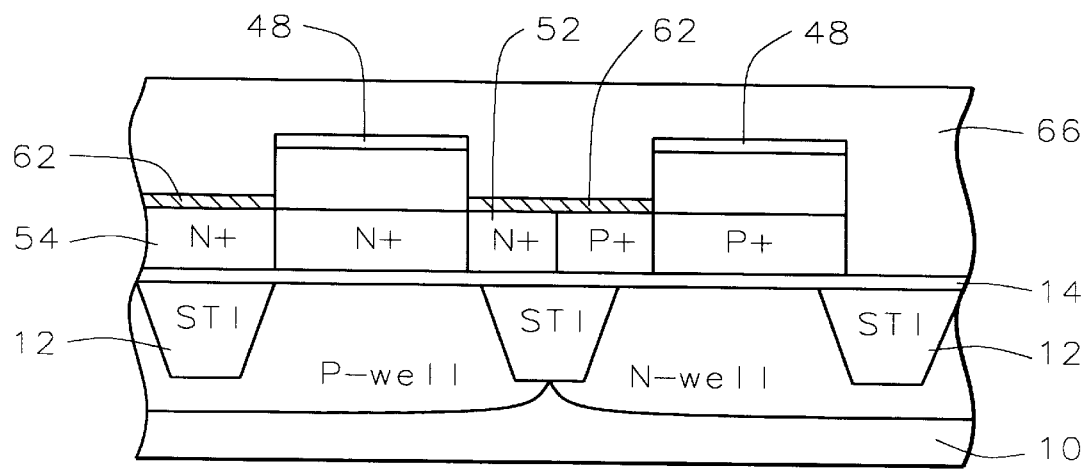

Referring now to FIG. 10, the unreacted titanium 60 is removed, leaving the salicided gate electrodes 52 and 54. A second annealing at a higher temperature of between about 800 and 900° C. is performed to transform the silicide to a higher resistance phase.

Figure 11A:
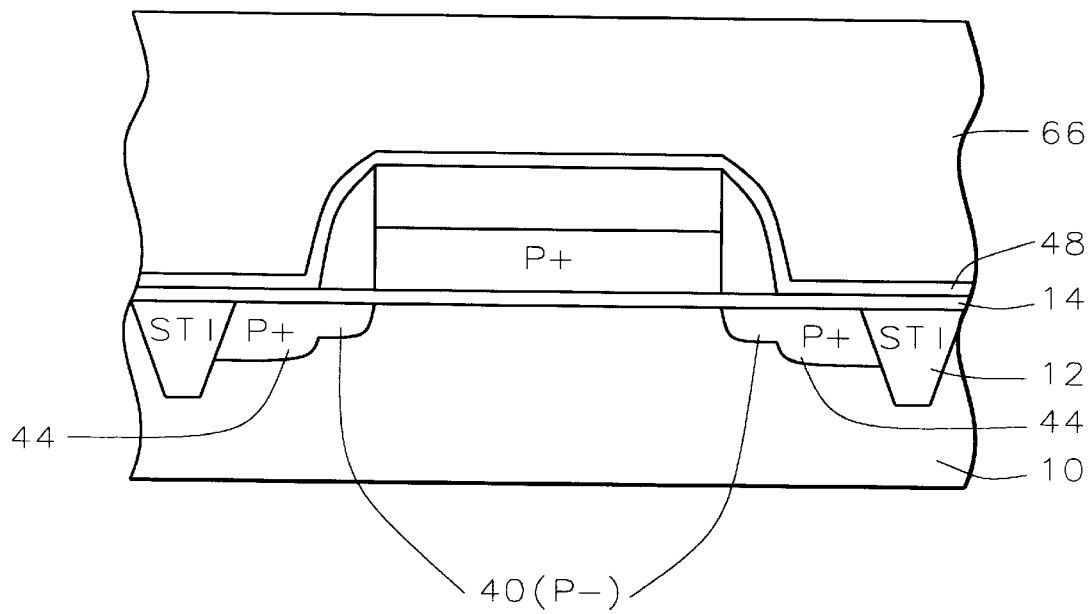
FIG. 11A is a cross-sectional representation of one preferred embodiment of the present invention in which a liner layer is deposited.
Figure 11B:
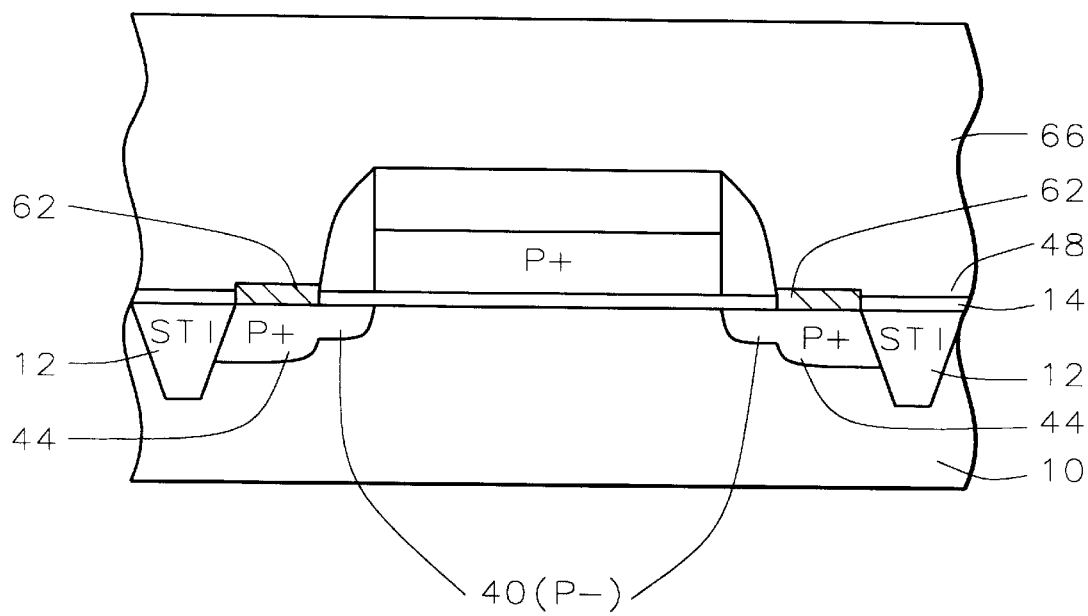
FIG. 11B is a cross-sectional representation of another preferred embodiment of the present invention in which no liner layer is deposited.

FIG. 11A shows the view of cross-section II—II of FIG. 15. FIG. 11B shows the same view in another preferred embodiment of the invention in which the silicon nitride liner layer 48 is not used. Silicidation will be the same in the cross-section view I—I for both options. However, in the cross-section II—II, if the liner layer 48 is not used, the source/drain regions 44 will be silicided as shown in FIG. 11B. Processing is the same in all other respects for both embodiments. The first embodiment will be shown in the following figures.

This completes the salicide process for the dual gate surface channel device. Now, the self-aligned contacts will be formed.

Referring now to FIG. 11A (or FIG. 11B), an interlevel dielectric layer 66 is deposited over the substrate. The interlevel dielectric layer may comprise silicon dioxide, tetraethoxysilane (TEOS) oxide, borophosphosilicate glass (BPSG), or the like. The interlevel dielectric layer is also illustrated in the view shown in FIG. 10.

Figure 12:
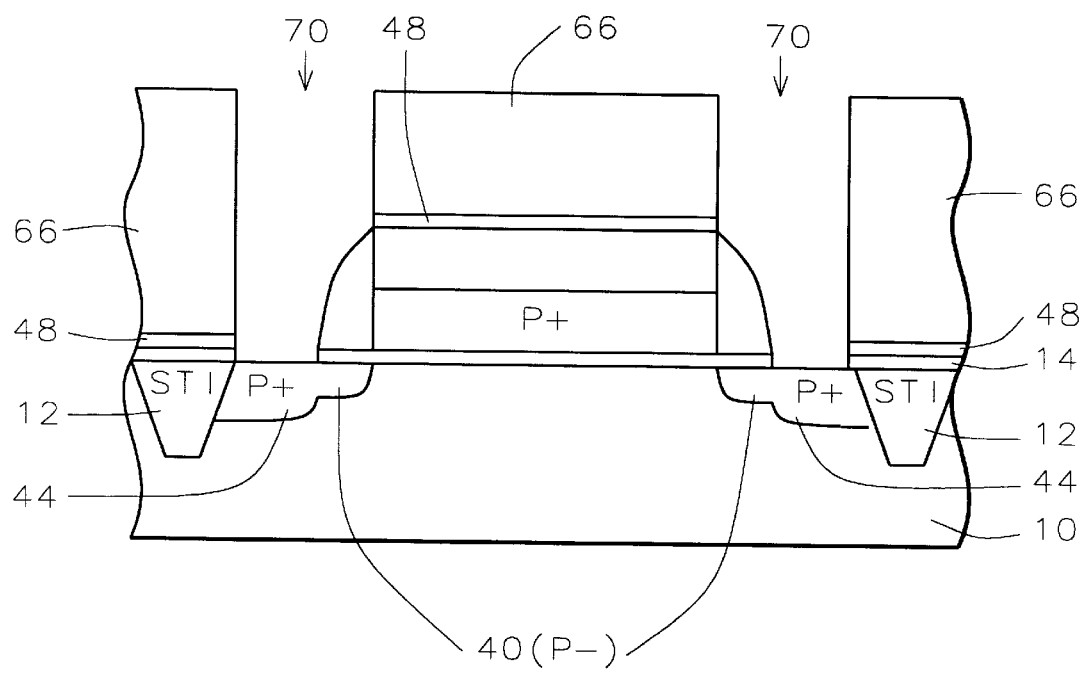

Conventional photolithography and etching are used to form the self-aligned contact openings 70, shown in FIG. 12. The PMOS gate region is shown in these figures. However, it will be understood that self-aligned contacts in the NMOS region are formed in the same way.

Figure 13:
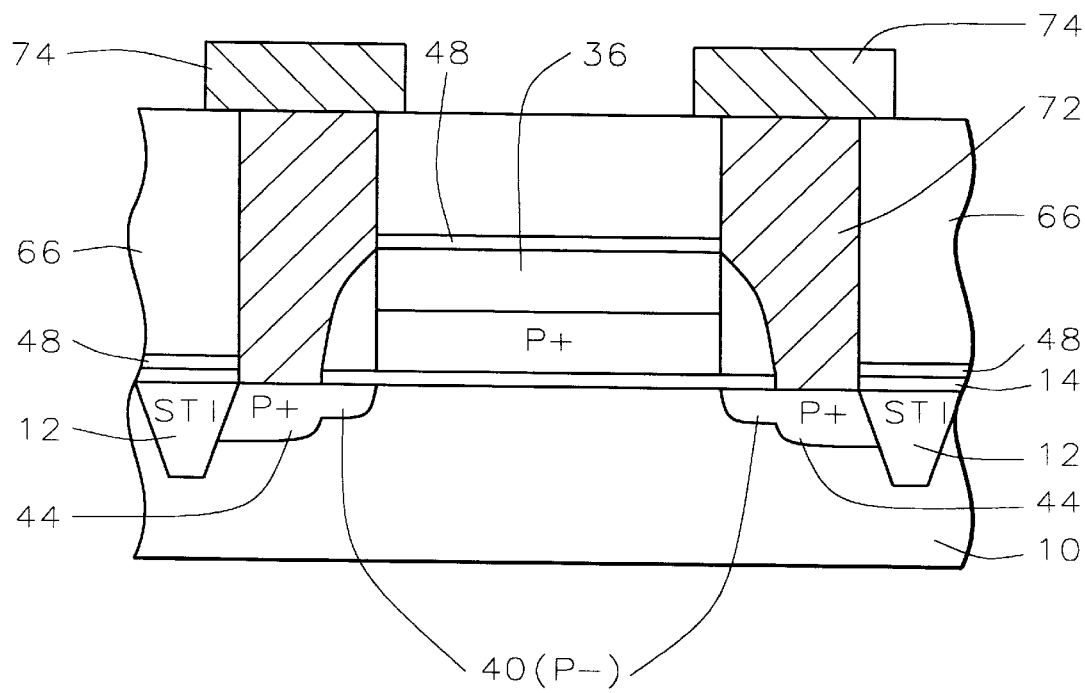

A conducting layer fills the contact openings, as shown in FIG. 13. For example, tungsten plugs 72 might fill the contact openings, followed by deposition and patterning of metal lines such as aluminum 74 to complete the electrical connections.

Figure 14:
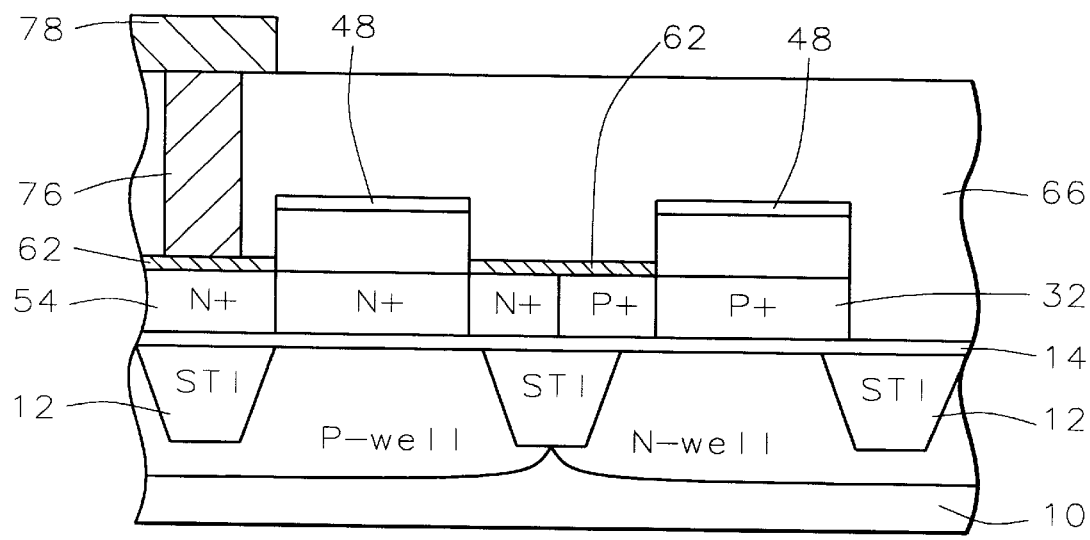

Also, contact openings are made to the silicided gates, as desired, such as to NMOS gate 54 as shown in FIG. 14. For example, tungsten plug 76 fills the contact opening and metal line 78 completes the contact to the silicided gate 54.

FIG. 15 is a top view of the CMOS dual gate surface channel device of the invention. View I—I is illustrated in cross-section in FIGS. 1–3, 7–10, and 14. View II—II is illustrated in cross-section in FIGS. 4–6, and 11–13. The NMOS gate section is above the imaginary central line 80 and the PMOS gate section is below the line 80. CMOS gate 52 contains the junction of NMOS and PMOS gates and is covered by silicide layer 62. NMOS and PMOS self-aligned contacts 72 are illustrated. Contact 76 to silicided NMOS gate 54 is illustrated at the top of the figure.

The process of the present invention integrates the salicide process for dual gate surface channel CMOS devices with the self-aligned contact process. The process of the invention forms a partial silicide layer only in the dual gate area 52 and in the contact area 54. Since the silicide layer does not cover the entire active region, autodoping is avoided. Also, since the silicide layer is formed after the formation and drive-in of the LDD and source/drain regions 40 and 44, respectively, and spacers 42, thermal cycling takes place before silicidation and therefore cannot degrade the silicide. In the process of the invention, the source/drain regions may be silicided or not, depending upon design considerations. Forming the silicon nitride liner layer over the substrate and over the hard mask before partially removing the hard mask will prevent silicidation of the source/drain regions.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

forming isolation areas on a semiconductor substrate surrounding and electrically isolating device areas;

providing a gate oxide layer in said device areas;

depositing a polysilicon layer overlying said gate oxide layer and said isolation areas;

implanting ions into said polysilicon layer to define a surface channel dual gate wherein an NMOS channel area is formed in one of said device areas and wherein a PMOS channel area is formed in an adjoining one of said device areas and wherein the junction where said NMOS channel area meets said PMOS channel area forms a CMOS gate area;

depositing a hard mask layer overlying said polysilicon layer;

patterning said hard mask layer and said polysilicon layer to form an NMOS gate in a portion of said NMOS channel area, a PMOS gate in a portion of said PMOS channel area and a CMOS gate in said CMOS gate area wherein said CMOS gate comprises an NMOS gate adjacent to and adjoining a PMOS gate;

forming spacers on the sidewalls of said gates;

forming source and drain regions within said semiconductor substrate associated with said gates;

thereafter removing said hard mask layer overlying said CMOS gate and overlying one of said NMOS or PMOS gates where a contact is to be made to said gate while leaving said hard mask layer over non-gate areas of said NMOS and PMOS channel areas;

depositing a metal layer overlying said substrate and annealing said substrate wherein said metal layer is transformed into a metal silicide layer where it is not underlaid by said hard mask layer;

removing said metal layer that is not transformed into said metal silicide layer leaving said metal silicide layer overlying said CMOS gate, overlying said gate to which a contact is to be made, and overlying said source and drain regions;

depositing an insulating layer over the surface of said semiconductor substrate;

forming a self-aligned contact opening through said insulating layer to one of said source and drain regions;

forming a contact opening through said insulating layer to said metal silicide layer overlying said gate where said contact is to be made;

depositing a conducting layer over said semiconductor substrate and within said self-aligned contact opening and within said contact opening and patterning said conducting layer to complete fabrication of said integrated circuit device.

2. The method according to claim 1 wherein said hard mask layer comprises silicon nitride having a thickness of between about 1500 and 3000 Angstroms.

3. The method according to claim 1 wherein said hard mask layer comprises silicon nitride having a thickness of between about 1000 and 3000 Angstroms overlying silicon dioxide having a thickness of between about 100 and 1000 Angstroms.

4. The method according to claim 1 further comprising depositing an etch stop layer overlying said gates and associated source and drain regions and overlying said hard mask layer wherein said etch stop layer prevents said metal silicide layer from being formed overlying said source and drain regions.

5. The method according to claim 4 wherein said etch stop layer comprises silicon nitride deposited to a thickness of between about 100 and 600 Angstroms.

6. The method according to claim 1 wherein said spacers comprise silicon nitride.

7. The method according to claim 1 wherein said metal layer comprises titanium.

8. The method according to claim 1 wherein said metal layer comprises cobalt.

9. The method according to claim 1 wherein said annealing is a rapid thermal anneal (RTA) performed in a nitrogen ambient at a temperature of between about 600 and 700° C.

10. A method of fabricating an integrated circuit device comprising:

forming isolation areas on a semiconductor substrate surrounding and electrically isolating device areas;

providing a gate oxide layer in said device areas;

depositing a gate layer overlying said gate oxide layer and said isolation areas;

implanting ions into said gate layer to define a surface channel dual gate wherein an NMOS channel area is formed in one of said device areas and wherein a PMOS channel area is formed in an adjoining one of said device areas and wherein the junction where said NMOS channel area meets said PMOS channel area forms a CMOS gate area;

depositing a hard mask layer overlying said gate layer;

patterning said hard mask layer and said gate layer to form an NMOS gate in a portion of said NMOS channel area, a PMOS gate in a portion of said PMOS channel area and a CMOS gate in said CMOS gate area wherein said CMOS gate comprises an NMOS gate adjacent to and adjoining a PMOS gate;

forming spacers on the sidewalls of said gates;

forming source and drain regions within said semiconductor substrate associated with said gates;

depositing an etch stop layer overlying said gates and associated source and drain regions;

thereafter removing said hard mask layer and said etch stop layer overlying said CMOS gate and overlying one of said NMOS or PMOS gates where a contact is to be made to said gate while leaving said hard mask layer over non-gate areas of said NMOS and PMOS channel areas;

depositing a metal layer overlying said substrate and annealing said substrate wherein said metal layer is transformed into a metal silicide layer where it is not underlaid by said hard mask layer or by said etch stop layer;

removing said metal layer that is not transformed into said metal silicide layer leaving said metal silicide layer overlying said CMOS gate and overlying said gate to which a contact is to be made;

depositing an insulating layer over the surface of said semiconductor substrate;

forming a self-aligned contact opening through said insulating layer to one of said source and drain regions;

forming a contact opening through said insulating layer to said metal silicide layer overlying said gate where said contact is to be made;

depositing a conducting layer over said semiconductor substrate and within said self-aligned contact opening and within said contact opening and patterning said conducting layer to complete fabrication of said integrated circuit device.

11. The method according to claim 10 wherein said gate layer comprises polysilicon.

12. The method according to claim 10 wherein said gate layer comprises amorphous silicon.

13. The method according to claim 10 wherein said hard mask layer comprises silicon nitride having a thickness of between about 1500 and 3000 Angstroms.

14. The method according to claim 10 wherein said hard mask layer comprises silicon nitride having a thickness of between about 1000 and 3000 Angstroms overlying silicon dioxide having a thickness of between about 100 and 1000 Angstroms.

15. The method according to claim 10 wherein said spacers comprise silicon nitride.

16. The method according to claim 10 wherein said etch stop layer comprises silicon nitride deposited to a thickness of between about 100 and 600 Angstroms.

17. The method according to claim 10 wherein said metal layer comprises titanium.

18. The method according to claim 10 wherein said metal layer comprises cobalt.

19. The method according to claim 10 wherein said annealing is a rapid thermal anneal (RTA) performed in a nitrogen ambient at a temperature of between about 600 and 700° C. and further comprising a second annealing at a temperature of between about 800 and 900° C. after said unreacted metal layer has been removed to transform said metal silicide layer to a lower resistance phase.

20. A method of fabricating an integrated circuit device comprising:

forming isolation areas on a semiconductor substrate surrounding and electrically isolating device areas;

providing a gate oxide layer in said device areas;

depositing a gate layer overlying said gate oxide layer and said isolation areas;

implanting ions into said gate layer to define a surface channel dual gate wherein an NMOS channel area is formed in one of said device areas and wherein a PMOS channel area is formed in an adjoining one of said device areas and wherein the junction where said NMOS channel area meets said PMOS channel area forms a CMOS gate area;

depositing a hard mask layer overlying said gate layer;

patterning said hard mask layer and said gate layer to form an NMOS gate in a portion of said NMOS channel area, a PMOS gate in a portion of said PMOS channel area and a CMOS gate in said CMOS gate area wherein said CMOS gate comprises an NMOS gate adjacent to and adjoining a PMOS gate;

forming spacers on the sidewalls of said gates;

forming source and drain regions within said semiconductor substrate associated with said gates;

thereafter removing said hard mask layer overlying said CMOS gate and overlying one of said NMOS or PMOS gates where a contact is to be made to said gate while leaving said hard mask layer over non-gate areas of said NMOS and PMOS channel areas;

depositing a metal layer overlying said substrate and annealing said substrate wherein said metal layer is transformed into a metal silicide layer where it is not underlaid by said hard mask layer;

removing said metal layer that is not transformed into said metal silicide layer leaving said metal silicide layer overlying said CMOS gate, overlying said gate to which a contact is to be made, and overlying said source and drain regions;

depositing an insulating layer over the surface of said semiconductor substrate;

forming a self-aligned contact opening through said insulating layer to one of said source and drain regions;

forming a contact opening through said insulating layer to said metal silicide layer overlying said gate where said contact is to be made;

depositing a conducting layer over said semiconductor substrate and within said self-aligned contact opening and within said contact opening and patterning said conducting layer to complete fabrication of said integrated circuit device.

21. The method according to claim 20 wherein said gate layer comprises polysilicon.

22. The method according to claim 20 wherein said gate layer comprises amorphous silicon.

23. The method according to claim 20 wherein said hard mask layer comprises silicon nitride having a thickness of between about 1500 and 3000 Angstroms.

24. The method according to claim 20 wherein said hard mask layer comprises silicon nitride having a thickness of between about 1000 and 3000 Angstroms overlying silicon dioxide having a thickness of between about 100 and 1000 Angstroms.

25. The method according to claim 20 wherein said spacers comprise silicon nitride.

26. The method according to claim 20 further comprising depositing an etch stop layer overlying said gates and associated source and drain regions and overlying said hard mask layer wherein said etch stop layer prevents said metal silicide layer from being formed overlying said source and drain regions.

27. The method according to claim 26 wherein said etch stop layer comprises silicon nitride deposited to a thickness of between about 100 and 600 Angstroms.

28. The method according to claim 20 wherein said metal layer comprises titanium.

29. The method according to claim 20 wherein said metal layer comprises cobalt.

30. The method according to claim 20 wherein said annealing is a rapid thermal anneal (RTA) performed in a nitrogen ambient at a temperature of between about 600 and 700° C. and further comprising a second annealing at a temperature of between about 800 and 900° C. after said unreacted metal layer has been removed to transform said metal silicide layer to a lower resistance phase.

* * * * *